United States Patent

Yoshida

[11] 4,310,898
[45] Jan. 12, 1982

[54] MINIMUM MAGNETIC BUBBLE DRIVING CIRCUITS FOR MULTIPLE COILS

[75] Inventor: Kazutoshi Yoshida, Mobara, Japan
[73] Assignee: Hitachi, Ltd., Tokyo, Japan
[21] Appl. No.: 1,456
[22] Filed: Jan. 8, 1979

[30] Foreign Application Priority Data

Mar. 24, 1978 [JP] Japan .................................. 53/33065

[51] Int. Cl.³ .............................................. G11C 19/08
[52] U.S. Cl. .......................................... 365/6; 365/226
[58] Field of Search .............................. 365/6, 226, 1

[56] References Cited

U.S. PATENT DOCUMENTS

| | | | |
|---|---|---|---|
| 3,943,497 | 3/1976 | Yoshizawa et al. | 365/6 |
| 3,958,160 | 5/1976 | de Niet et al. | 365/6 |
| 4,106,088 | 8/1978 | Bergan | 365/6 |
| 4,153,880 | 5/1979 | Navratil | 365/6 |

OTHER PUBLICATIONS

*Controlling Inplane Field Coil Currents ...*, Belser et al. I.B.M. Tech. Discl. Bull.; vol. 20, No. 12; pp. 5315-5316; 5/78.

*Primary Examiner*—Marshall M. Curtis
*Attorney, Agent, or Firm*—Charles E. Pfund

[57] ABSTRACT

The driving circuit for supplying current to coils for generating a rotating magnetic field is divided into a switch side circuit and a driver side circuit so as to pass current through only one of the coils. Each of the switch side circuit and the driver side circuit is constituted by a number of component circuits. The driving circuit comprises (N+M) component circuits for driving (N×M) coil circuits, where N represents the number of the component circuits of the switch side circuit and M that of the component circuits of the driver side circuit whereby additional coils may be driven without multiplying the number of driving circuits.

6 Claims, 20 Drawing Figures

MINIMUM MAGNETIC BUBBLE DRIVING CIRCUITS FOR MULTIPLE COILS

BACKGROUND OF THE INVENTION

This invention relates to a magnetic bubble memory driving circuit for generating a rotating magnetic field which is utilized to propagate magnetic bubbles.

In order to propagate magnetic bubbles between propagation patterns, it is necessary to apply a plain rotating field in a magnetic film in which the magnetic bubbles are present.

Figure 1:
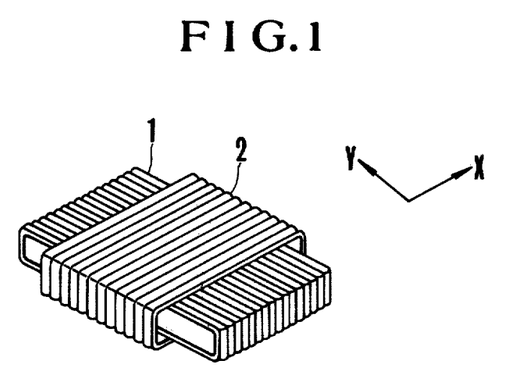
FIG. 1 is a perspective view showing a coil block for producing a rotating magnetic field.

FIG. 1 is a perspective view showing a coil block for generating a rotating magnetic field, in which an X coil 1 and a Y coil 2 are arranged at right angles and a bubble memory chip, not shown, which is contained in these coils. The magnetic field produced by the X coil 1 is directed in the direction of arrow X and the magnetic flux generated by the Y coil 2 is directed in the direction of arrow Y so that when a sine wave current is passed through the X coil 1 and a sine wave current lagged by 90° is passed through the coil 2, a rotating magnetic field having a circular magnetic field locus and rotating in the counterclockwise direction will be formed.

This system, however, requires an oscillating circuit to produce sine wave currents, and there is a trend, in recent years, toward use of direct current voltage which is applied to the coils to generate triangular current by the inductance of the coils.

Figures 2A, 2B:
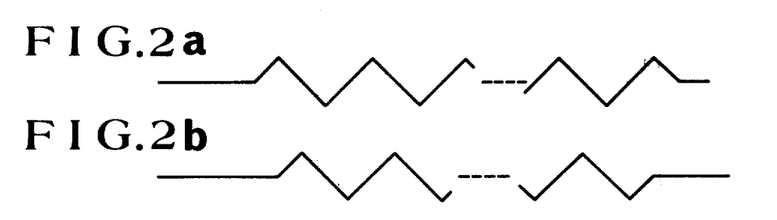
FIGS. 2a and 2b show triangular currents passed through the coils of the coil block.
Figure 3:
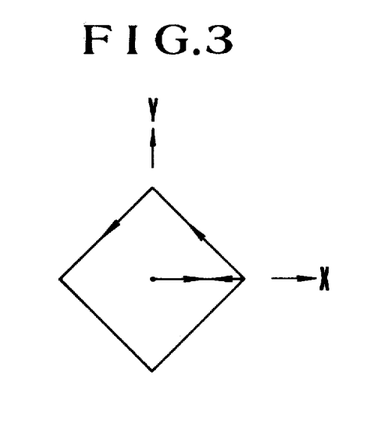
FIG. 3 is a diagram showing a locus of the magnetic field.

FIGS. 2a and 2b show waveforms of the triangular currents flowing through X coil and Y coil respectively, and FIG. 3 shows the magnetic field locus. When a triangular current is passed through the X coil and a triangular current lagged by 90° is passed through the Y coil, a rotating magnetic field having a square magnetic field locus will be produced.

Figure 4:
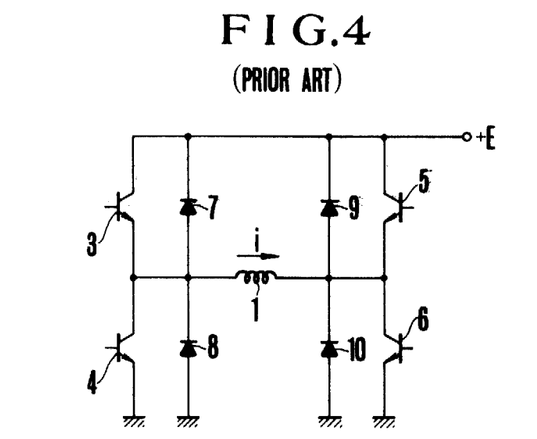
FIG. 4 is a prior art driving circuit for producing a triangular current.
Figure 5A:
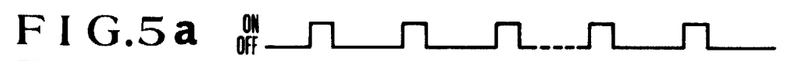
FIG. 5a, 5b and 5c shows the waveforms of the driving circuit shown in FIG. 4.
Figure 5B:
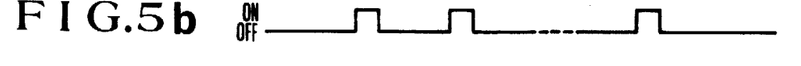
Figure 5C:
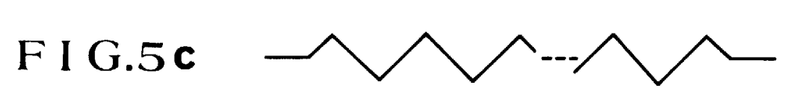

FIG. 4 shows an example of a driving circuit which has hitherto been used for producing such a triangular current, and FIGS. 5a, 5b and 5c show the time chart of this circuit. In FIG. 4, reference numerals 3, 4, 5 and 6 designate transistors and 7, 8, 9 and 10 diodes which are connected as shown. When transistors 3 and 6 are turned on simultaneously, a source of DC designated at + E applies a voltage to the X coil 1 with its left side positive and right side negative so that current flows in the direction of arrow i. This direction is called the positive direction. Since the applied DC voltage is constant, the current increases linearly due to the inductance of the X coil 1. When transistors 3 and 6 are turned off after a predetermined time, the electromagnetic energy that has been stored in the coil 1 decreases and current flows to the DC source through diodes 8 and 9, this current decreasing linearly. This decreasing time is substantially equal to the interval in which transistors 3 and 6 have been turned on. Accordingly, a positive triangular current will be produced during an interval twice on the "ON" period of transistors 3 and 6. Subsequently, when transistors 4 and 5 are simultaneously turned on, a voltage is impressed across the X coil in the opposite direction so that current flows through this coil in the opposite direction which increases linearly. When transistors 4 and 5 are turned off after a predetermined time, the electromagnetic energy that has been stored in the X coil 1 decreases and current flows to the source via diodes 7 and 10 which decreases linearly. Accordingly, a negative triangular current will be obtained during an interval twice the "ON" time of transistors 4 and 5. Thereafter, this operation is repeated to produce a continuous triangular current. These states are shown by FIGS. 5a through 5c, in which FIG. 5a shows the ON-OFF states of transistors 3 and 6, FIG. 5b the ON-OFF states of transistors 4 and 5, and FIG. 5c shows the triangular current flowing through the X coil 1 and identical to FIG. 2a. The triangular current flowing through Y coil 2 can be produced by a similar circuit.

The above-described triangular wave currents having a phase difference of 90° flow through X coil 1 and Y coil 2 and the magnetic fields produced thereby are synthesized to form a rotating magnetic field adapted to propagate magnetic bubbles.

However, in the prior art magnetic bubble driving circuit, one set of driving circuits each including 4 transistors and 4 diodes has been necessary for each coil, so that as the number of the magnetic bubble elements increases, the number of the coils increases and the number of the driving circuits also increases, thus increasing the cost and occupied space.

SUMMARY OF THE INVENTION

Accordingly, it is an object of this invention to provide an improved magnetic bubble driving circuit in which the number of the driving circuit does not increase at the great rate with the increase in the number of coils for generating the rotating magnetic field, thereby decreasing the cost of manufacturing and the size of the driving circuit.

According to this invention, there is provided a magnetic bubble driving circuit of the type wherein the driving circuit for supplying current to a plurality of coils which generate a rotating magnetic field is divided into a switch side circuit and a driver side circuit for passing current through a predetermined one of the coils, wherein the driving circuit adapted to drive (N×M) coil circuits comprises (N+M) component circuits, where N represents the number of the component circuits of the switch side circuit, and M the number of the component circuits of the driver side circuit.

BRIEF DESCRIPTION OF THE DRAWINGS

In the accompanying drawings:

FIG. 9b shows the current produced by the outputs shown in FIG. 9a.

DESCRIPTION OF THE PREFERRED EMBODIMENTS

Figure 6:
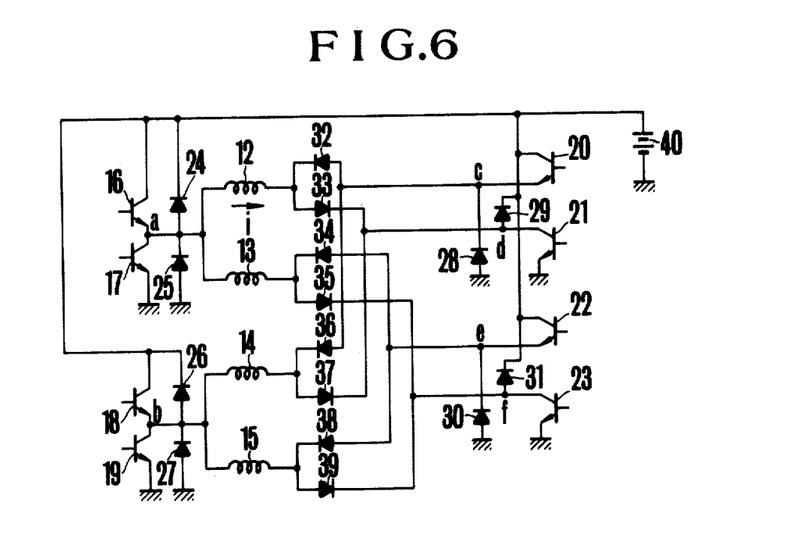
FIG. 6 is a connection diagram showing one embodiment of a magnetic bubble driving circuit embodying the invention.

In one embodiment of this invention shown in FIG. 6, there are used four coils 12, 13, 14 and 15. A switching element on the switch side circuit comprises transistors 16, 17, 18 and 19, whereas a switching element on the driver side circuit comprises transistors 20, 21, 22 and 23. Transistors 16, 17, 18 and 19 are connected in series in the forward direction with respect to a DC source 40. Diodes 24 and 25 and diodes 26 and 27 are connected in series in the reverse direction with respect to the DC source. The junction a between transistors 16 and 17 and the junction b between transistors 18 and 19 are connected respectively to the junctions between diodes 24 and 25 and diodes 26 and 27. Transistors 16 and 17 and diodes 24 and 25 constitute a switch side first component circuit while transistors 18 and 19 and diodes 26 and 27 constitute a second component circuit. The number of the switch side component circuits is N. In this example N=2.

The switch side terminals of coils 12 and 13 are commonly connected to the junction a while the switch side terminals of coils 14 and 15 are commonly connected to the junction b.

Transistor 20 is connected in series with the DC source in the forward direction while diode 28 is connected in series with the DC source in the reverse direction. Diode 29 is connected in series with the DC source in the reverse direction whereas transistor 21 is connected in series in the forward direction. Transistor 22 is connected in series in the forward direction, diode 30 in the reverse direction, diode 31 in the reverse direction and transistor 23 in the forward direction. These elements constitute driver side circuit, in which transistors 20, 21 and diodes 28, 29 comprise a driver side first component circuit, and transistors 22, 23 and diodes 30, 31 a driver side second component circuit. In this example, the number M of the driver side component circuits is M=2.

A junction c between transistor 20 and diode 28 and a junction e between transistor 22 and diode 30 each constitute a first connection terminal to coil circuit. A junction d between diode 29 and transistor 21, and a junction f between diode 31 and transistor 23 each constitute a second connnection terminal to coil circuit.

The righthand end of coil 12 is connected to oppositely poled diode 32 and 33 and the righthand end of coil 13 is also connected to oppositely poled diodes 34 and 35. In the same manner, the righthand ends of coils 14 and 15 are respectively connected to oppositely poled diodes 36, 37 and 38, 39 thus forming $N \times M = 2 \times 2 = 4$ coil circuits. The other ends of coils 12 and 13 are connected to a common junction a on the switch side, while the other ends of coils 14 and 15 are connected to a common junction b. The anode electrodes of the diodes 32 and 36 are commonly connected to junction c of the driver side first component circuit, whereas the cathode electrodes of diodes 33 and 37 are commonly connected to junction d. In the same manner, the anode electrodes of diodes 35 and 38 are connected to junction e, and the cathode electrodes of diodes 36 and 39 are connected to the junction e of the second component circuit. Thus, the number of component circuit of the driving circuit of this embodiment is $N+M=4$.

When coil 12 among the four coils described above is selected to pass triangular current, the switch side first component circuit comprising transistors 16 and 17, and the driver side first component circuit comprising transistors 20 and 21 are selected. Thus, when transistors 16 and 21 are simultaneously turned on, a voltage is impressed across coil 12 from DC source 40 with the switch side terminal positive and the driver side terminal negative. Consequently, the current of coil 12 flows through diode 33 and increases substantially linearly. In the absence of diodes 32 to 39 on the driver side, the voltage impressed across the selected coil would also be applied across a circuit for connecting the other non-selected three coils in series to pass a current therethrough. Since diodes 34 and 39 have opposite polarities, the current flowing through coil 13 and then coil 15 would be precluded so that current flows only through coil 12. When transistor 16 and 21 are turned off after a predetermined time, current i corresponding to the electromagnetic energy stored in coil 12 flows through diodes 33, 29 and 25 towards the DC source 40, thus decreasing substantially linearly. Since the decreasing time is nearly equal to the "ON" period of transistors 16 and 21, a positive triangular current flows for an interval twice the "ON" period. Then, when transistors 17 and 20 are turned on at the same time, the voltage is impressed across the coil 12 in the opposite direction so that the current of coil 12 increases linearly in the negative direction. In the same manner as described above, the current tending to flow through coils 14, 15 and 13 is blocked by diodes 38 and 35 so that the current flows only through coil 12. When transistors 17 and 20 are turned off, current corresponding to the energy stored in the coil 12 flows toward the DC source 40 through diodes 28, 32 and 24 and this current decreases linearly, thus producing negative triangular current.

When a cycle of turning-on of transistors 16 and 21 simultaneous with turning-off of all of the other transistors and turning-on of transistors 17 and 20 simultaneous with turning-off of all of the other transistors is repeated, a continuous triangular current as shown in FIG. 5c will flow through coil 12.

As can be noted from the foregoing description, diodes 25 and 27 are necessary to form a shorting circuit for dissipating via the DC source the energy stored in the coil by the current flowing in the forward direction, while diodes 28 and 30 are necessary to form a shorting circuit for dissipating via the DC source the energy stored in the coil by the current flowing in the reverse direction. As will be described later, a trapezoid current can be produced in the same manner as the triangular current except that there is included a time during which the coil is short-circuited by a circuit not including the DC source.

When the coil 13 is selected to pass triangular current, the switch side first component circuit including transistors 16 and 17 and the driver side second component circuit including transistors 22 and 23 are operated. Where the coil 14 is selected to pass triangular current, the switch side second component circuit transistors 18 and 19, and the driver side first component circuit including transistors 20 and 21 are operated. Furthermore, where coil 15 is selected to pass triangular current, the switch side second component circuit including transistors 18 and 19, and the driver side second component circuit including transistors 22 and 23 are operated. In this embodiment, four coils are selected to pass current and 8 transistors are used. Where a circuit as shown in FIG. 4 were used for the prior art device, since it is necessary to use four transistors per coil, it is necessary to use 16 transistors for four coils. According to this invention, the number of transistors is reduced to one half.

In the foregoing embodiment, where the number of the switch side component circuits is N=2 and that of the driver side component circuits is M=2, the driving circuit for driving N×M=4 coil circuits comprises N+M=4 component circuits. According to the prior art circuit shown in FIG. 4, the total number of the switch side component circuits including transistor 3 and 4 and diodes 7 and 8, and of the driver side component circuits including transistors 5 and 6 and diodes 9 and 10 must be 2 ×N×M=8. As shown in the following table, as the number of the coils increases more and more, the advantage of decreasing the number of the driving circuits of the system of this invention can be highlighted.

TABLE

| number of switch side component circuits N | number of driver side component circuits M | number of coil circuits N × M | number of component circuits of the prior art driving circuit 2 × N × M | number of component circuits of the driving circuit of this invention N + M |
|---|---|---|---|---|
| 1 | 1 | 1 | 2 | 2 |
| 1 | 2 | 2 | 4 | 3 |
| 2 | 2 | 4 | 8 | 4 |
| 4 | 2 | 8 | 16 | 6 |
| 4 | 4 | 16 | 32 | 8 |

Figure 7:
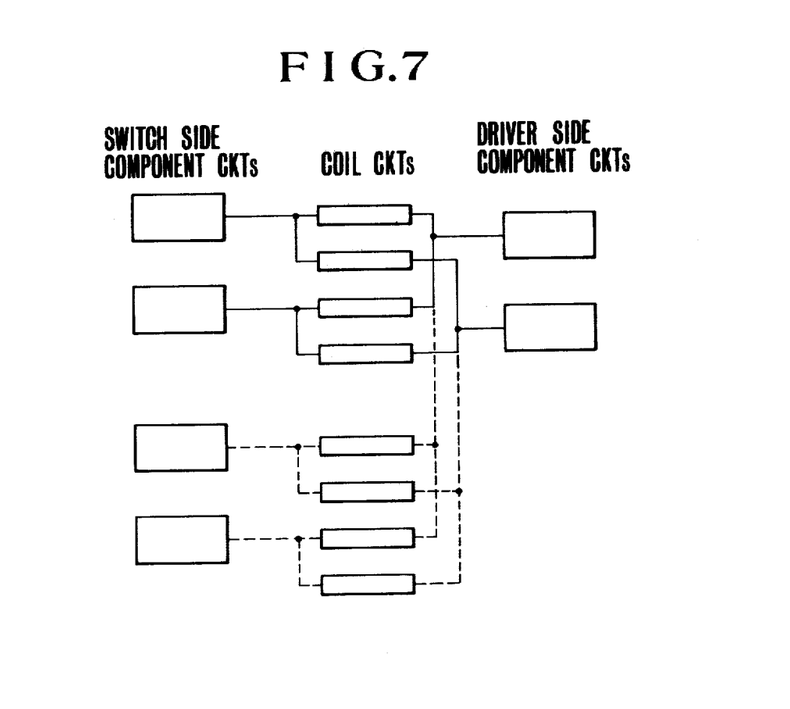
FIG. 7 is a diagram showing a manner of parallelly connecting a plurality of driving circuits according to this invention.

To increase the number of the coils, the coil circuits are connected in parallel to the switch side circuit or as shown by dotted lines in FIG. 7, coil circuits are connected in parallel to the driver side component circuits.

Figure 8:
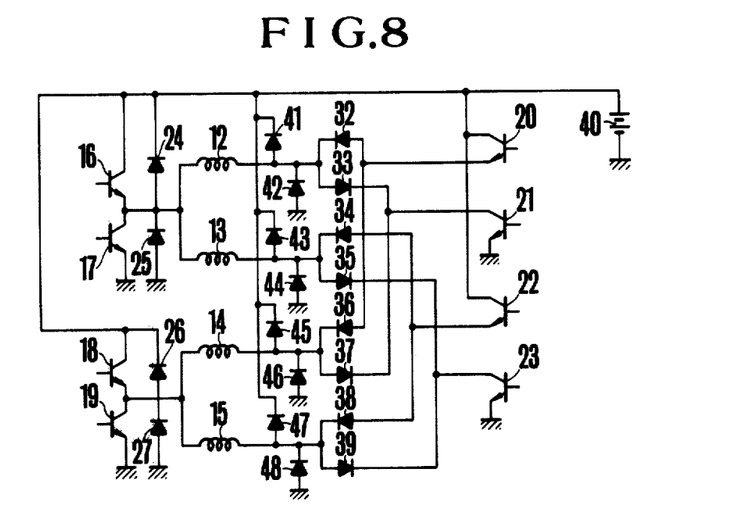
FIG. 8 is a connection diagram showing a modification of this invention.

FIG. 8 shows another embodiment of this invention in which diodes corresponding to diodes 28, 29, 30 and 31 shown in FIG. 6 are incorporated in the coil circuits. In this case too, N=2, M=2, N×M=4, and N+M=4. More particularly, the junction between diodes 41 and 42 which are connected in series in the reverse direction with respect to the DC source 40 is connected to the right-hand terminal (driver side) of coil 12, and the junction between diodes 43 and 44 which are connected in series in the reverse direction with respect to the DC source is connected to the driver side terminal of coil 13. In the same manner, the junction between diodes 45 and 46, and diodes 47 and 48 are connected to the driver side terminal of the coils 14 and 15 respectively. Transistors 16 and 17, and diodes 24 and 25 constitute the switch side first component circuit, and transistors 18 and 19 and diodes 26 and 27 constitute the second component circuit in the same manner as the embodiment shown in FIG. 6. In this embodiment, however, transistors 20 and 21 constitute the driver side first component circuit, while transistors 22 and 23 constitute the second component circuit. Diodes 32, 33, 41 and 42 form a coil circuit associated with coil 12. Coil circuits associated with coils 13, 14 and 15 are formed in the same manner.

Although the embodiment shown in FIG. 8 operates substantially in the same manner as that shown in FIG. 6, when the forward current corresponding to the energy stored in coil 12 decreases, this current flows through two diodes 25 and 41. In the embodiment shown in FIG. 6, however, this current flows through three diodes 25, 34 and 29. Also when the reverse current decreases, it flows through two diodes 42 and 24. Accordingly, the voltage drop of the circuit decreases by an amount corresponding to the voltage drop across one diode. Accordingly, the interval in which the current decreases becomes longer, thus improving the symmetry of the triangular wave.

Figure 9A:
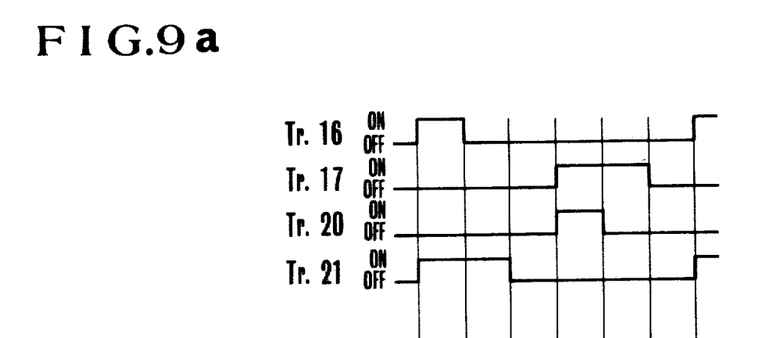
FIG. 9a shows transistor outputs for producing a frustum shaped current.
Figure 9B:
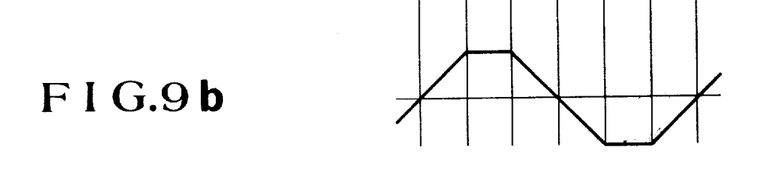
Figure 9C:
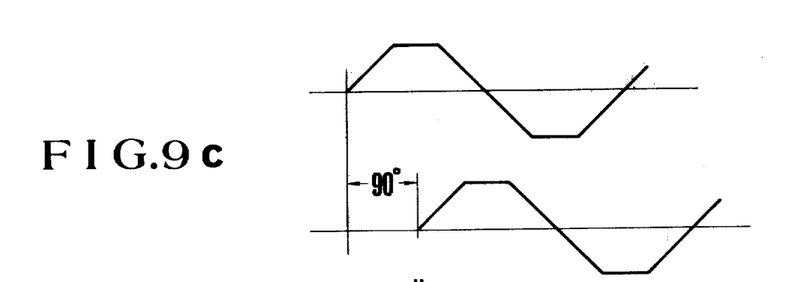
FIG. 9c shows two trapezoid currents, out of phase by 90°, passed through coils.
Figure 9D:
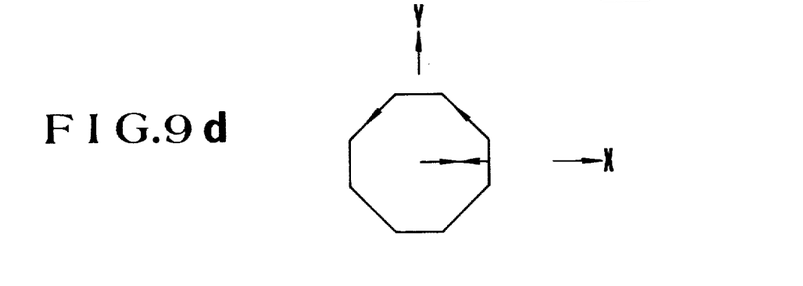
FIG. 9d shows a locus of a rotating magnet field produced by the trapezoid currents.

In the embodiments described above, the polarity of the DC source is positive but a source of the opposite polarity can be used provided that the polarity of the diodes is reversed. In addition to triangular current, it is possible to pass trapezoid current as shown in FIG. 9b by slightly modifying the ON-OFF timing of the transistors as shown in FIG. 9a. When the phase between the trapezoid currents for the X and Y coils is shifted 90° as shown in FIG. 9c, it is possible to create a rotating magnetic field having a locus as shown in FIG. 9d. The manner of producing the trapezoid current shown in FIG. 9b will now be described briefly with reference to FIG. 9a which shows the ON-OFF timing of transistors 16, 17, 20 and 21 for passing current through coil 12. Thus, when transistors 16 and 21 are turned on, a forward current which increases substantially linearly will flow through transistor 16, coil 12, diode 33 and transistor 21. When transistor 16 is turned off next time, since transistor 21 is still maintained "ON", the energy stored in coil 12 passes substantially constant forward current through coil 12, diode 33, transistor 21, and diode 25. When transistor 21 is turned off, current corresponding to the energy stored in coil 12 flows through diodes 33 and 29, source 40 and diode 25. This current decreases substantially linearly to zero during an interval corresponding to the "ON" period of transistor 16, thus completing a positive half cycle. Then, transistors 17 and 20 are turned on to pass negative current (whose absolute value increases substantially linearly) through transistor 20, diode 32, coil 12 and transistor 17. When the transistor 20 is turned off, so long as the transistor 17 is maintained "ON", a constant current flows through coil 12, transistor 17 and diodes 28 and 32. When transistor 17 is turned off, a negative current whose absolute value decreases linearly flows through coil 12, diode 24, source 40 and diode 28 and 32, thus completing one cycle of the trapezoid current.

Considering the symmetry of the triangular current, with the circuit shown in FIG. 4 the symmetry of the waveform is poor. More particularly, in the circuit shown in FIG. 4, the current i which flows through coil 1 when transistors 3 and 6 are turned on is approximated by the following equation:

$$i = \frac{E - V_{CE3} - V_{CE6}}{L} \cdot t \quad (1)$$

where L represents the inductance of coil 1, and the resistance of the coil is neglected. Character t represents a time lapse following the time (t=0) when transistors 3 and 6 are turned on, and $V_{CE3}$ and $V_{CE6}$ represent the collector-emitter voltages of transistors 3 and 6.

Figures 10A, 10B, 11:
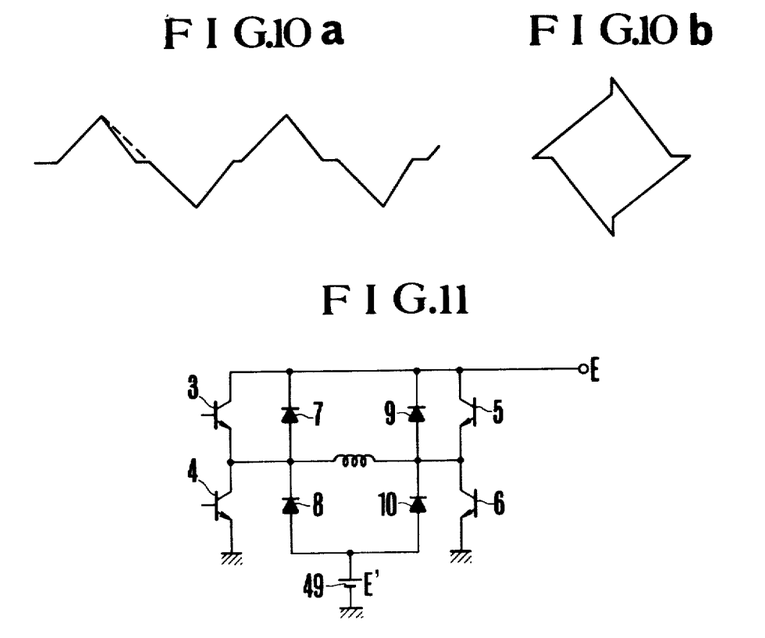
FIG. 10a is a waveform showing asymmetrical distortions of a triangular current.
FIG. 10b is a locus of the rotating magnetic field produced by asymmetrical triangular current.
FIG. 11 is a connection diagram showing the circuit shown in FIG. 4 incorporated with an asymmetrical distortion compensation circuit.

When transistors 3 and 6 are turned off at t=0, the current $i_2$ flowing through coil 1 is approximated by $$i_2 = I_0 - \frac{E + V_{D8} + V_{D9}}{L} \cdot t \quad (2)$$

where $I_0$ represents current flowing through coil 1 at t=0, and $V_{D8}$ and $V_{D9}$ represent the forward voltages of diodes 8 and 9. As equations (1) and (2) clearly show, the slope of the current is steeper in equation (2). In other words the current falls more rapidly than it rises so that, as shown by dotted lines in FIG. 10a, the current waveform becomes asymmetrical. Accordingly, when the rotating magnetic field is formed with this current, its locus becomes distorted as shown in FIG. 10b.

A circuit as shown in FIG. 11 may be used to obviate this problem, in which a source 49 having a voltage of E' is used. Rising of the current when transistor 3 and 6 are turned on is managed by equation (1). However, the falling of the current is corrected as follows by source E'

$$i = I_0 - \frac{E - E' + V_{D8} + V_{D9}}{L} \cdot t \quad (3)$$

In order to make equal the slopes of the current at the rise and fall, it is necessary to make $$E - V_{CE3} - V_{CE6} = E - E' + V_{D8} + V_{D9}$$

which reduces to $$E' = V_{D8} + V_{D9} + V_{CE3} + V_{CE6} \cdots \quad (4)$$

In other words, where the value of E' is selected to a suitable value, it is possible to make equal the rising and falling times, thereby improving the symmetry.

Figure 12:
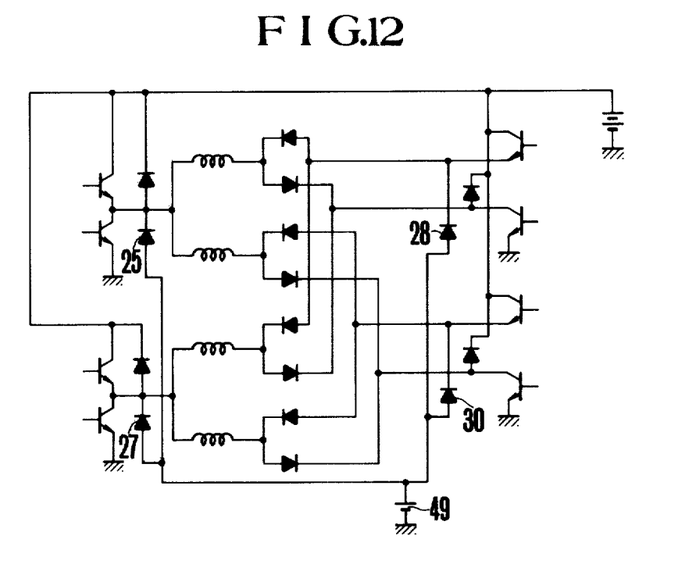
FIG. 12 shows a modified current in which a compensation circuit is added to the circuit shown in FIG. 6.
Figure 13:
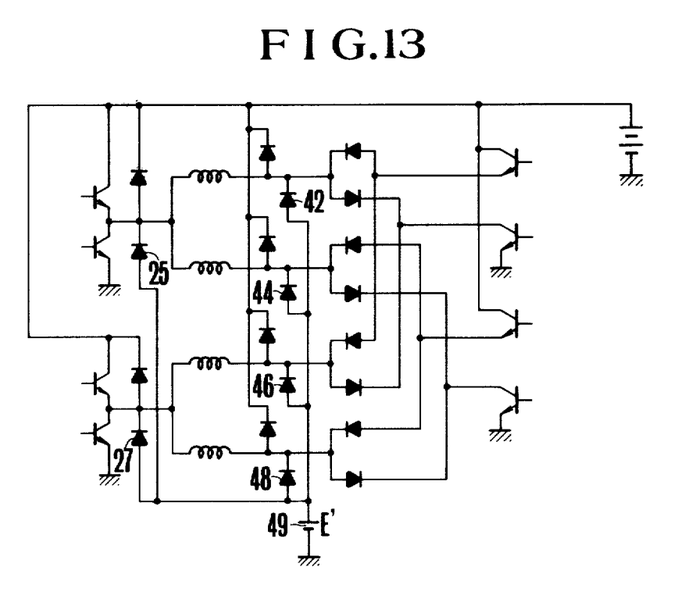
FIG. 13 shows a modified circuit in which a compensation circuit is added to the circuit shown in FIG. 8.

FIGS. 12 and 13 show modified embodiments of this invention wherein an additional source is used for the purpose of improving the symmetry of the waveform. In these modifications, the diodes which form the shorting circuit of the coil, that is diodes 25, 27, 28 and 30 in FIG. 12 and diodes 25, 27, 42, 44, 46 and 48 in FIG. 13 are not grounded directly but they are grounded through a compensating circuit including an additional source 49, thereby compensating the asymmetry of the triangular current.

Although in the foregoing embodiments, transistors were used as the switching elements, other various switching elements than transistors can also be used.

In the magnetic bubble driving circuit of this invention, even when the number of coils for generating the rotating magnetic field is increased with the increase of the number of the magnetic bubble elements, it is not necessary to proportionately increase the number of the driving circuit whereby it is possible to decrease the size and cost.

What is claimed is:

1. In a magnetic bubble driving circuit adapted to drive (N×M) coil circuits of the type wherein the driving circuit for supplying current to a plurality of coils which generate rotating magnetic field is divided into a switch side circuit and a driver side circuit for passing current through a predetermined one of the coils, the improvement wherein said driving circuit comprises (N+M) component circuits, where N represents the number of the component circuits of the switch side circuit and M the number of the component circuits of the driver side circuit wherein N+M≧3, said coil circuits connected in parallel between N switch side component circuits and M driver side component circuits through opposed steering diode circuit means for selecting a unique path for each polarity of current flow through each coil circuit.

2. In a magnetic bubble driving circuit of the type wherein the driving circuit for supplying current to a plurality of coils which generate rotating magnetic field is divided into a switch side circuit and a driver side circuit for passing current through a predetermined one of the coils, the improvement wherein said driving circuit adapted to drive (N×M) coil circuits comprises (N+M) component circuits, where N represents the number of the component circuits of the switch side circuit and M the number of the component circuits of the driver side circuit, wherein each switch side component circuit comprises two switching elements which are connected in series in the forward direction with respect to a DC source, and two diodes which are connected in series in the reverse direction with respect to said DC source, the junction between said switching elements and that between said diodes being connected in common to constitute a coil connecting terminal; wherein each driver side component circuit comprises:

(1) a circuit including, with respect to said DC source, a forward switching element and a reverse diode which are connected in series, the junction between said forward switching element and said reverse diode constituting a first connection terminal to a respective coil circuit, and (2) a circuit including, with respect to said DC source, a reverse diode and a forward switching element which are connected in series, the junction between said reverse diode and said forward switching element constituting a second connection terminal to said coil circuit;

and wherein each coil circuit comprises one of said coils and two diodes whose opposite polarity ends are connected to the driver side terminal of said one coil, the switch side terminal of said one coil of said coil circuit being connected to the coil connecting terminal of said switch side component circuit, and said diodes of said coil circuit being connected between said driver side terminal of said one coil and said first and second connection terminals of said driver side component circuit in the forward direction with respect to said switching elements of said driver side component circuit.

3. In a magnetic bubble driving circuit of the type wherein the driving circuit for supplying current to a plurality of coils which generate rotating magnetic field is divided into a switch side circuit and a driver side circuit for passing current through a predetermined one of the coils, the improvement wherein said driving circuit adapted to drive (N×M) coil circuits comprises (N+M) component circuits, where N represents the number of the component circuits of the switch side circuit and M the number of the component circuits of the driver side circuit, wherein each switch side component circuit comprises two switching elements which are connected in series in the forward direction with respect to a DC source, and two diodes which are connected in series in the reverse direction with respect to said DC source, the junction between said switching elements and that between said diodes being connected in common to constitute a coil connecting terminal; wherein each driver side component circuit comprises a first switching element with one end forwardly connected with one pole of said DC source and the other end constituting a first connection terminal to coil circuit, and a second switching element with one end forwardly connected with the other pole of said DC source and the other end constituting a second connection terminal to coil circuit; and wherein each coil circuit comprises one of said coils, two diodes whose opposite polarity ends are connected to the driver side terminal of said coil, and two diodes which are connected in series in the reverse direction with respect to said DC source with the junction therebetween connected to said opposite polarity ends, the former two diodes being connected between said first and second connection terminals to coil circuit of said driver side component circuit in the forward direction with respect to said switching elements of said driver side component circuit.

4. The driving circuit according to claims 2 or 3 wherein said switching elements comprise transistors.

5. The driving circuit according to claim 2 which further comprises an additional DC source which is connected to grounding diodes for forming shorting circuits for the coils in said switch side component circuits and said driver side component circuits.

6. The driving circuit according to claim 3 which further comprises an additional DC source which is connected to grounding diodes for forming short circuits for the coils in said switch side component circuits and said coil circuits.

* * * * *